United States Patent
Hirasawa et al.

(10) Patent No.: US 12,372,553 B2
(45) Date of Patent: Jul. 29, 2025

(54) JUMPER ELEMENT, SHUNT RESISTOR APPARATUS, AND METHOD OF ADJUSTING CHARACTERISTIC OF SHUNT RESISTOR APPARATUS FOR CURRENT DETECTION

(71) Applicant: KOA CORPORATION, Ina (JP)

(72) Inventors: Koichi Hirasawa, Ina (JP); Shuhei Matsubara, Ina (JP); Katsuhide Nishizawa, Ina (JP); Keishi Nakamura, Ina (JP)

(73) Assignee: KOA CORPORATION, Ina (JP)

( * ) Notice: Subject to any disclaimer, the term of this patent is extended or adjusted under 35 U.S.C. 154(b) by 113 days.

(21) Appl. No.: 18/028,610

(22) PCT Filed: Aug. 11, 2021

(86) PCT No.: PCT/JP2021/029608
§ 371 (c)(1),
(2) Date: Mar. 27, 2023

(87) PCT Pub. No.: WO2022/070623
PCT Pub. Date: Apr. 7, 2022

(65) Prior Publication Data
US 2023/0333143 A1 Oct. 19, 2023

(30) Foreign Application Priority Data
Sep. 30, 2020 (JP) ................. 2020-164803

(51) Int. Cl.
*G01R 1/20* (2006.01)
*G01R 15/14* (2006.01)

(52) U.S. Cl.
CPC ........... *G01R 1/203* (2013.01); *G01R 15/146* (2013.01)

(58) Field of Classification Search
CPC .............................. G01R 1/203; G01R 15/146
See application file for complete search history.

(56) References Cited

U.S. PATENT DOCUMENTS

| 2005/0258930 A1* | 11/2005 | Ishida ................... H01C 1/148 338/309 |
| 2013/0181807 A1 | 7/2013 | Hetzler |

(Continued)

FOREIGN PATENT DOCUMENTS

| CN | 102696079 A | 9/2012 |
| JP | 2011-3694 A | 1/2011 |

(Continued)

OTHER PUBLICATIONS

Office Action dated Jan. 20, 2025, issued in counterpart CN application No. 202180066209.6, with English translation. (14 pages).

(Continued)

*Primary Examiner* — Reena Aurora
(74) *Attorney, Agent, or Firm* — WHDA, LLP

(57) ABSTRACT

The present invention relates to a jumper element, a shunt resistor apparatus, and a method of adjusting characteristic of a shunt resistor apparatus for current detection. The jumper element (10) for constituting the shunt resistor apparatus for current detection is made of conductive metal material. The jumper element (10) includes: a body structure (11) that can be coupled to a resistance element (5) constituting a part of the shunt resistor apparatus; and a protrusion (12) formed on a side portion of the body structure (11), wherein the protrusion (12) is located so as not to overlap the resistor element (5).

7 Claims, 15 Drawing Sheets

(56) References Cited

U.S. PATENT DOCUMENTS

| | | |
|---|---|---|
| 2017/0162302 A1 | 6/2017 | Chiku |
| 2017/0192038 A1* | 7/2017 | Kawamoto ............ G01R 1/203 |
| 2017/0307658 A1 | 10/2017 | Chiku et al. |
| 2020/0011899 A1 | 1/2020 | Tsukahara et al. |

FOREIGN PATENT DOCUMENTS

| | | | |
|---|---|---|---|
| JP | 2012-227360 A | 11/2012 | |
| JP | 2013-536424 A | 9/2013 | |
| JP | 2016-4886 A | 1/2016 | |
| JP | 2016-503176 A | 2/2016 | |
| JP | 2018-132386 A | 8/2018 | |
| JP | 2018-170478 A | 11/2018 | |
| WO | 2011/028870 A1 | 3/2011 | |
| WO | 2016063928 A1 | 4/2016 | |

OTHER PUBLICATIONS

International Search Report dated Oct. 26, 2021, issued in counterpart International Application No. PCT/JP2021/029608, with English Translation. (4 pages).

\* cited by examiner

JUMPER ELEMENT, SHUNT RESISTOR APPARATUS, AND METHOD OF ADJUSTING CHARACTERISTIC OF SHUNT RESISTOR APPARATUS FOR CURRENT DETECTION

TECHNICAL FIELD

The present invention relates to a jumper element, a shunt resistor apparatus, and a method of adjusting a characteristic of a shunt resistor apparatus for current detection.

BACKGROUND ART

A jumper element has been used as a component which is mounted to a circuit board, such as a printed board. The jumper element is used, as an example, for crossing over wires in a circuit board. The jumper element is also used for short-circuiting lands which were formed for connecting parts therebetween when designed, but now it becomes not necessary, or for connecting a component and an interconnect pattern.

A shunt resistor is used as a component to be mounted to a circuit board. Specifically, the shunt resistor is used for detecting a current by detecting a voltage at both ends of the shunt resistor through which the current flows. The shunt resistor is widely used in current detecting applications.

As an example, patent document 1 discloses a shunt resistor in which electrodes and a resistance element are stacked and a mounted structure thereof. The shunt resistor described in the patent document 1 includes a disk-shaped resistance element and two electrodes formed on both sides of the resistance element. One of the two electrodes is coupled to an interconnect (pad), and the other electrode is connected to a first bonding wire. A second bonding wire is connected to the interconnect (pad), and a voltage drop due to the shunt resistor is extracted by the first and second bonding wires. A resistance of the shunt resistor is calculated by dividing a potential difference between the first bonding wire and the second bonding wire by a current flowing through the shunt resistor.

CITATION LIST

Patent Literature

Patent document 1: Japanese laid-open patent publication No. 2018-170478

SUMMARY OF INVENTION

Technical Problem

However, in the above-described shunt resistor, the electrode connected to the first bonding wire has a potential distribution. Shifting a connection position of the first bonding wire may cause a variation in the detected voltage, the detected resistance, or a temperature coefficient of resistance (T.C.R.) of the shunt resistor. The temperature coefficient of resistance is an index that indicates a rate of change in resistance due to temperature change.

The present invention has been made in view of the above-mentioned circumstances. It is therefore an object of the present invention to provide a jumper element for constituting a shunt resistor apparatus for current detection, wherein the jumper element is capable of suppressing a variation in characteristic of the shunt resistor apparatus due to a connection position of a wire for voltage detection connected to the jumper element. Further, an object of the present invention is to provide a shunt resistor apparatus for current detection capable of suppressing a variation in characteristic due to a connection position of a wire for voltage detection, and a method of adjusting the characteristic of such a shunt resistor apparatus.

Solution to Problem

In an embodiment, there is provided a jumper element for constituting a shunt resistor apparatus for current detection, comprising: a body structure that can be coupled to a resistance element constituting a part of the shunt resistor apparatus; and a protrusion formed on a side portion of the body structure, wherein the jumper element is made of conductive metal material, and the protrusion is located so as not to overlap the resistor element.

In an embodiment, the body structure has a body-structure-side first surface that can be coupled to the resistance element, and the protrusion has a protrusion-side first surface at the same side as the body-structure-side first surface in a thickness direction of the jumper element, and further has a protrusion-side second surface opposite to the protrusion-side first surface.

In an embodiment, a slit is formed in the protrusion, and the slit extends from a side surface of the protrusion In an embodiment, there is provided a shunt resistor apparatus for current detection, comprising: a plate-shaped resistance element having a first surface and a second surface opposite to the first surface; and a terminal member made of conductive metal material, wherein the terminal member includes: a body structure coupled to the first surface; and a protrusion formed on a side portion of the body structure, the protrusion is located so as not to overlap the resistance element.

In an embodiment, a slit is formed in the protrusion, and the slit extends from a side surface of the protrusion.

In an embodiment, the shunt resistor apparatus further comprises a pair of wires for detecting a potential difference in the resistance element, one of the pair of wires being coupled to the protrusion.

In an embodiment, there is provided a method of adjusting characteristic of a shunt resistor apparatus for current detection, comprising: adjusting a resistance and/or a temperature coefficient of resistance of the shunt resistor apparatus by forming a slit in a protrusion, wherein the shunt resistor apparatus includes: a plate-shaped resistance element having a first surface and a second surface opposite to the first surface; and a body structure made of conductive metal material and coupled to the first surface; and a terminal member including the protrusion formed on a side portion of the body structure.

Advantageous Effects of Invention

According to the present invention, a potential distribution in the protrusion has a high uniformity. As a result, the variation in characteristic of the shunt resistor apparatus due to a connection position of a wire for voltage detection on the protrusion can be suppressed.

DESCRIPTION OF EMBODIMENTS

Figure 1A:
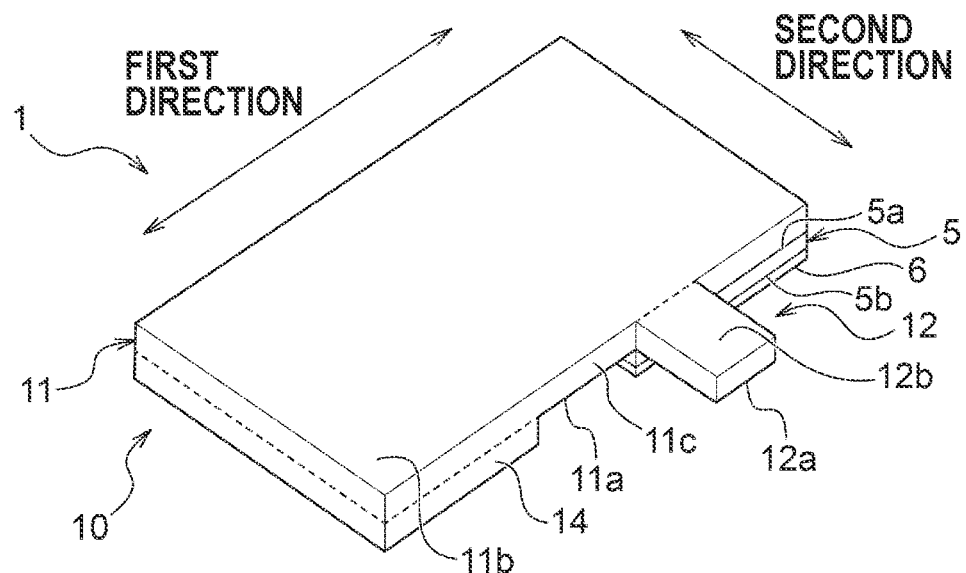
FIG. 1A is a perspective view schematically showing an embodiment of a shunt resistor apparatus for current detection.

Hereinafter, embodiments of the present invention will be described with reference to the drawings. In the drawings described below, identical or corresponding components will be denoted by identical reference numerals, and repetitive descriptions thereof are omitted. In this specification, a shunt resistor apparatus is defined as a device for current detection that includes at least a shunt resistor. Examples of the shunt resistor apparatus include a shunt resistor itself, a device that is equivalent to a shunt resistor by being mounted to a circuit board, etc., and a structure to which a shunt resistor has been mounted with various wires coupled thereto (i.e., a structure including the shunt resistor mounted thereto).

Figure 1B:
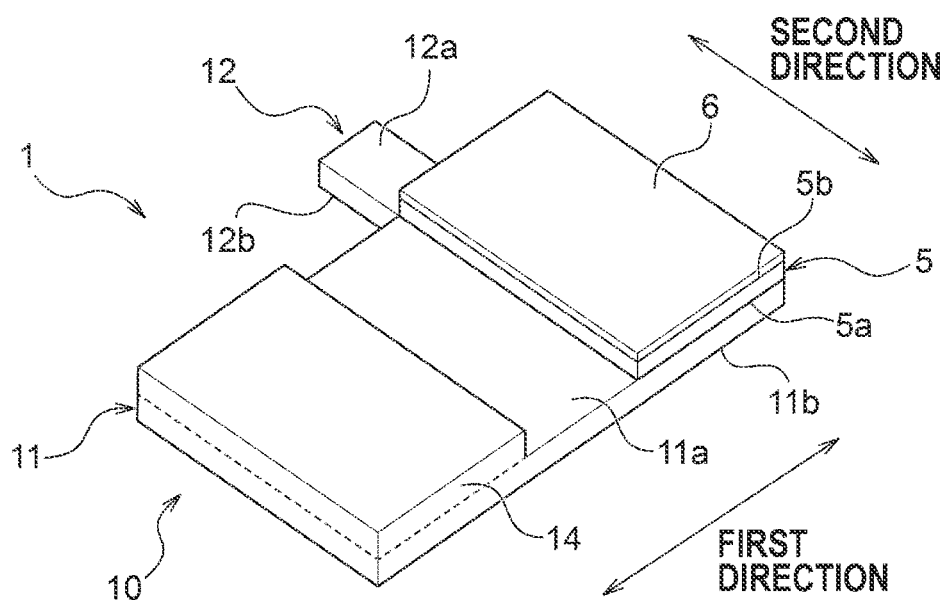
FIG. 1B is a perspective view of the shunt resistor apparatus shown in FIG. 1A as viewed from a back side.
Figure 1C:
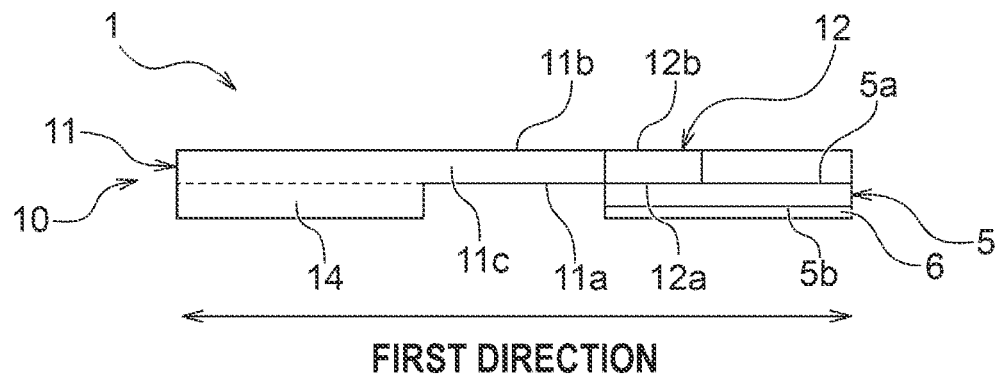
FIG. 1C is a side view of the shunt resistor apparatus shown in FIG. 1A.

FIG. 1A is a perspective view schematically showing an embodiment of a shunt resistor apparatus for current detection. FIG. 1B is a perspective view of the shunt resistor apparatus shown in FIG. 1A as viewed from a back side. FIG. 1C is a side view of the shunt resistor apparatus shown in FIG. 1A. As shown in FIGS. 1A to 1C, the shunt resistor apparatus includes a shunt resistor 1. In other words, the shunt resistor apparatus of this embodiment is the shunt resistor 1 itself. The shunt resistor 1 includes a plate-shaped (thin plate-shaped) resistance element 5 having a predetermined thickness and a predetermined width, a plate-shaped (thin plate-shaped) electrode 6 made of conductive metal material, and a jumper element (also referred to as a terminal member) made of conductive metal material.

An example of material of the resistance element 5 is low-resistance alloy material, such as Cu—Mg—Ni alloy. An example of material of the electrode 6 and the jumper element 10 is copper (Cu) which is highly conductive metal.

The resistance element 5 has a first surface 5a and a second surface 5b opposite to the first surface 5a. The jumper element 10 is connected (or is coupled) to the first surface 5a of the resistance element 5, and the electrode 6 is coupled to the second surface 5b of the resistance element 5. The electrode 6, the resistance element 5, and the jumper element 10 are stacked in this order in a thickness direction of the shunt resistor 1. The thickness direction of the shunt resistor 1 is perpendicular to both a first direction and a second direction. The first direction is a length direction of the shunt resistor 1. The second direction is a width direction of the shunt resistor 1 and is perpendicular to the first direction.

The jumper element 10 includes a plate-shaped body structure 11, a protrusion 12 formed on a side portion of the body structure 11, and a terminal structure 14 formed on a body-structure-side first surface 11a of the body structure 11. The body structure 11, the protrusion 12, and the terminal structure 14 constitute an integral structure and are made from the same material. The resistance element 5 is connected (or is coupled) to the body-structure-side first surface 11a of the body structure 11.

Figure 2:
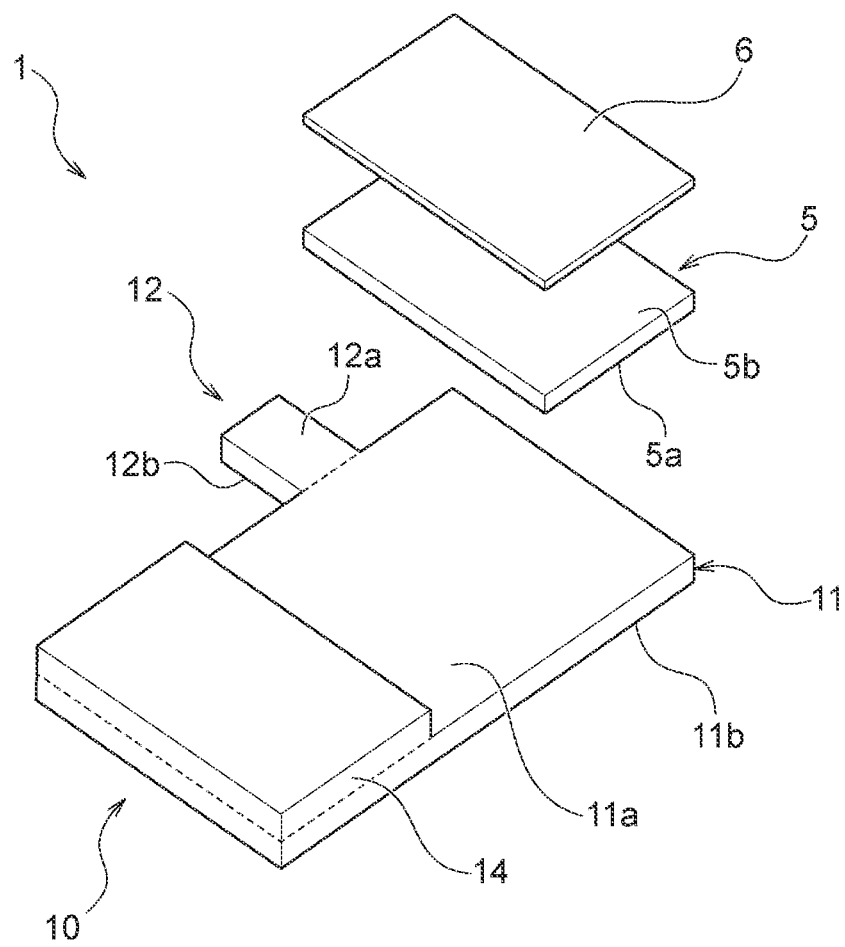
FIG. 2 is an exploded perspective view of a shunt resistor shown in FIGS. 1A to 1C.

FIG. 2 is an exploded perspective view of the shunt resistor 1 shown in FIGS. 1A to 1C. In one embodiment, the first surface 5a and the second surface 5b of the resistance element 5 are coupled (or are joined) to the jumper element 10 and the electrode 6, respectively, by welding (e.g., pressure welding), soldering, or joining with metal nanoparticles (e.g., silver paste using silver nanoparticles, or copper paste using copper nanoparticles). The terminal structure 14 and the electrode 6 have been subjected to surface treatment, such as Sn plating, in order to enable solder mounting.

The terminal structure 14 and the resistance element 5 are separated from each other in the first direction. Similarly, the terminal structure 14 and the electrode 6 are separated from each other in the first direction. In other words, the first direction can be said to be a direction in which the resistance element 5 and the terminal structure 14 are arrayed.

As described above, the protrusion 12 is formed on the side portion of the body structure 11. Specifically, the protrusion 12 is formed on a side surface 11c of the body structure 11 and protrudes from the side surface 11c in the second direction. The side surface 11c is parallel to the first direction. The protrusion 12 is located so as not to overlap the resistance element 5. In other words, the protrusion 12 is located so as not to overlap the resistance element 5 in the thickness direction of the shunt resistor 1, and is not in direct contact with the resistance element 5. More specifically, the protrusion 12 is formed in a portion of the body structure 11 that is located directly above the resistance element 5 when the first surface 5a of the resistance element 5 faces upward and the second surface 5b of the resistance element 5 faces downward. In one embodiment, the protrusion 12 may be formed on a side surface of the body structure 11 parallel second di recti on.

Figure 3A:
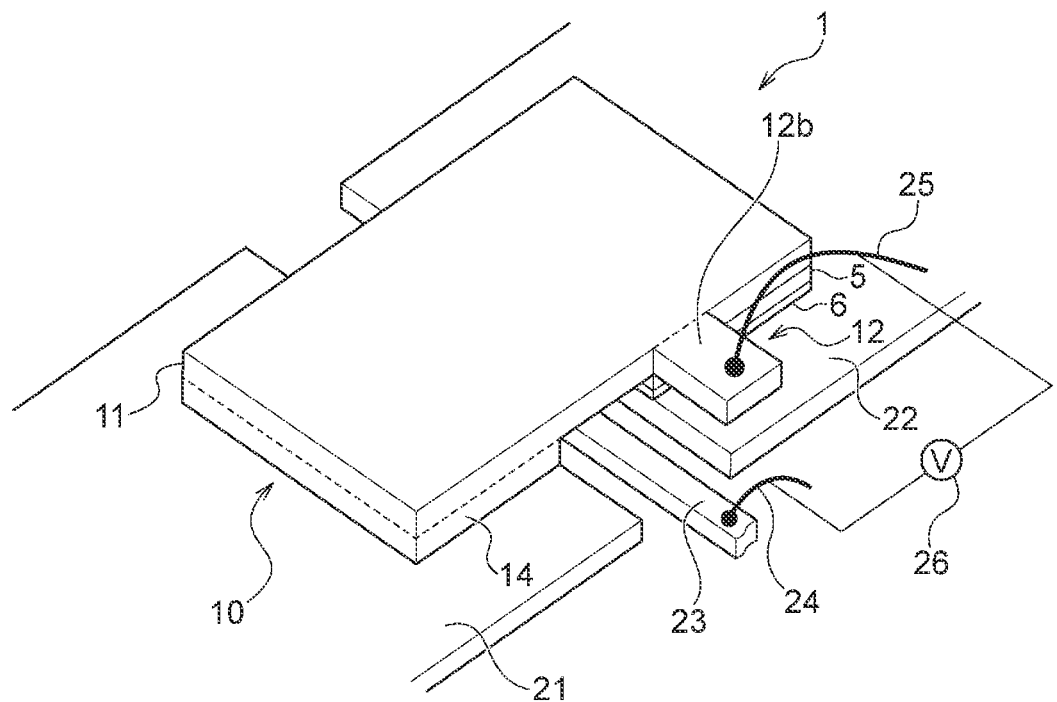
FIG. 3A is a perspective view schematically showing another embodiment of the shunt resistor apparatus.
Figure 3B:
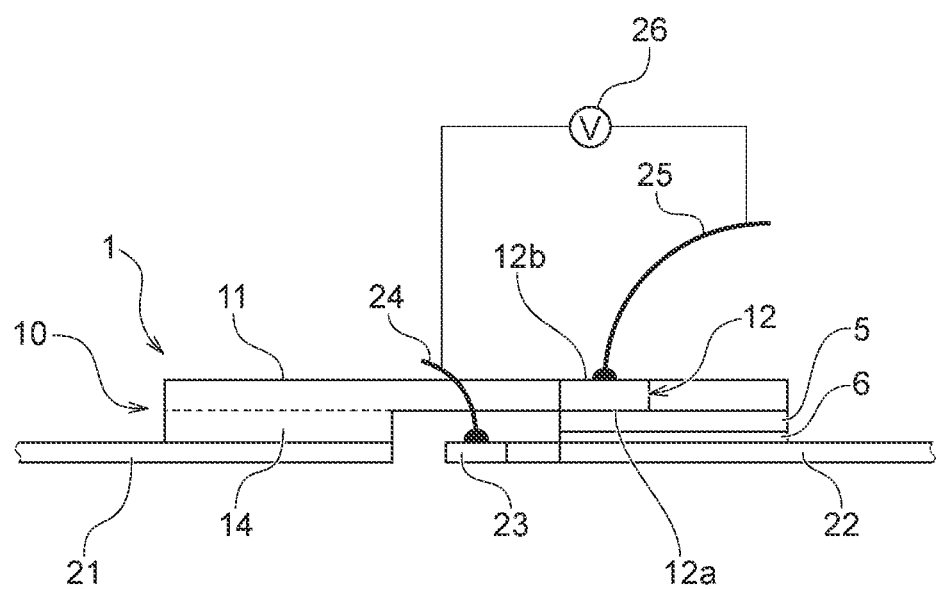
FIG. 3B is a side view of the shunt resistor apparatus shown in FIG. 3A.

The protrusion 12 has a protrusion-side first surface 12a at the same side as the body-structure-side first surface 11a in a thickness direction of the jumper element 10 (i.e., the thickness direction of the jumper element 10). Specifically, the body-structure-side first surface 11a and the protrusion-side first surface 12a lie in the same plane. The body structure 11 has a body-structure-side second surface 11b opposite to the body-structure-side first surface 11a, and the protrusion 12 has a protrusion-side second surface 12b opposite to the protrusion-side first surface 12a, Specifically, the body-structure-side second surface 11b and the protrusion-side second surface 12b lie in the same plane, FIG. 3A is a perspective view schematically showing another embodiment of the shunt resistor apparatus. FIG. 3B is a side view of the shunt resistor apparatus shown in FIG. 3A. Configurations of this embodiment, which will not be particularly described, are the same as those of the above-described embodiments, and duplicated descriptions will be omitted. The shunt resistor apparatus of this embodiment is a mounted structure of the shunt resistor 1. As shown in FIGS. 3A and 3B, the shunt resistor apparatus further includes interconnect patterns 21 and 22 to which the shunt resistor 1 is mounted, and a pair of wires 24 and 25 for detecting a potential difference in the resistance element (i.e., a potential difference between the first surface 5a and the second surface 5b). The wires 24 and 25 function as voltage-detection terminals.

The interconnect patterns 21 and 22 are mounted to a not-shown circuit board, such as a printed circuit board, and the interconnect patterns 21 and 22 are located away from each other. The terminal structure 14 and the electrode 6 are coupled (or are joined) to the interconnect pattern 21 and the interconnect pattern 22, respectively, by soldering or the like. The interconnect pattern 21, the shunt resistor 1, and the interconnect pattern 22 constitute a current path.

Figure 4:
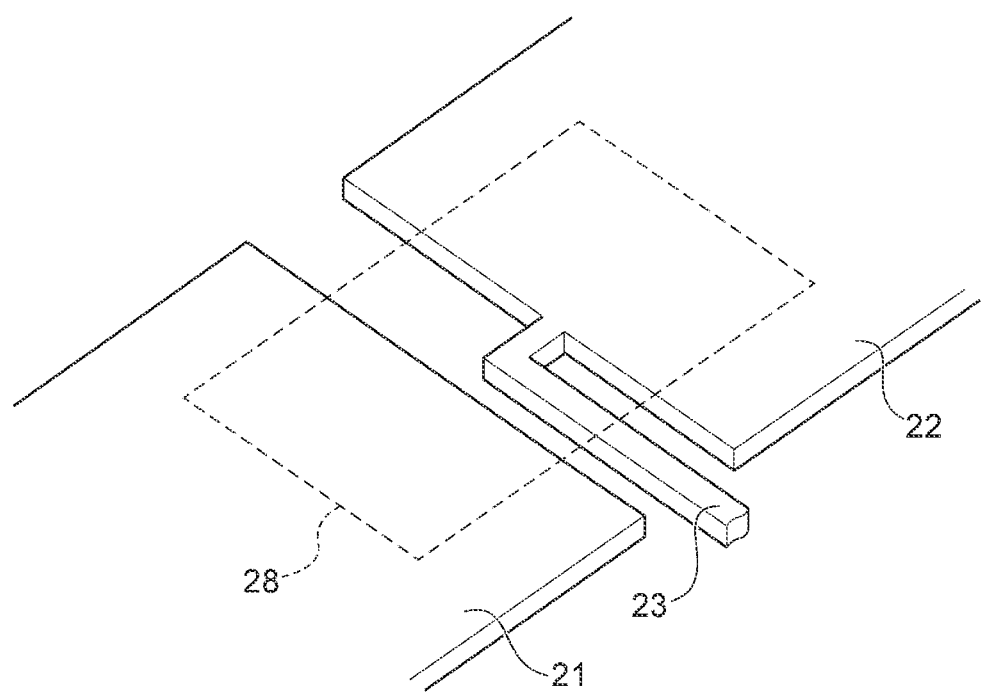
FIG. 4 is a perspective view showing the shunt resistor apparatus shown in FIGS. 3A and 3B from which the shunt resistor has been removed.

FIG. 4 is a perspective view showing the shunt resistor apparatus shown in FIGS. 3A and 3B from which the shunt resistor 1 has been removed. As shown in FIG. 4, the shunt resistor 1 is mounted in an area 28 enclosed by a dot-line shown in FIG. 4, As shown in FIG. 4, a lead 23 extends from the interconnect pattern 22. Specifically, the lead 23 extends from the interconnect pattern 22 toward the interconnect pattern 21 and then bends to extend in the second direction. The wire 24 is connected to the lead 23, and the wire 25 is connected to the protrusion-side second surface 12b of the protrusion 12.

In one embodiment, the wires 24 and 25 are bonding wires, and the wires 24 and are connected to the lead 23 and the protrusion-side second surface 12b, respectively, by wire bonding. The lead 23 and the protrusion 12 function as bonding pads. The lead 23 and the protrusion-side second surface 12b have been subjected to surface treatment, such as Ni—P plating, in order to enable wire bonding.

According to this embodiment, a potential difference between the wire 24 and the wire 25 (i.e., the potential difference in the resistance element 5) caused by current to be measured flowing through the shunt resistor 1 can be measured at the wires 24 and 25. In this embodiment, the potential difference in the resistance element 5 is measured by a voltmeter 26 constituted of a voltage measuring 1C, or the like. Although an example in which a voltage signal is input to the voltmeter 26 via the wire 24 and the wire 25 has been shown, the lead 23 may be directly coupled to the voltmeter 26. In that case, the lead 23 and the wire 25 function as a pair of wires for detecting the potential difference.

Figure 5A:
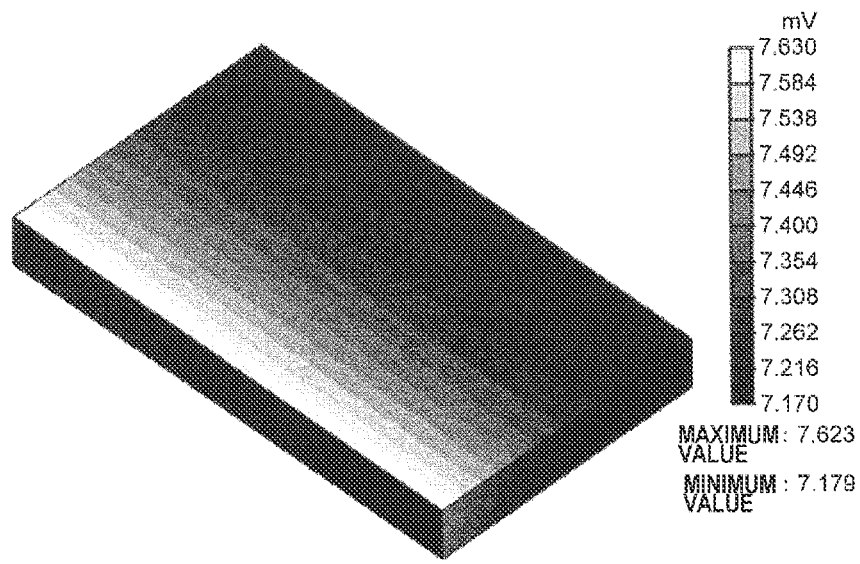
FIG. 5A is a diagram showing a potential distribution in a portion of a body structure located directly above a resistance element when a jumper element does not have a protrusion.
Figure 5B:
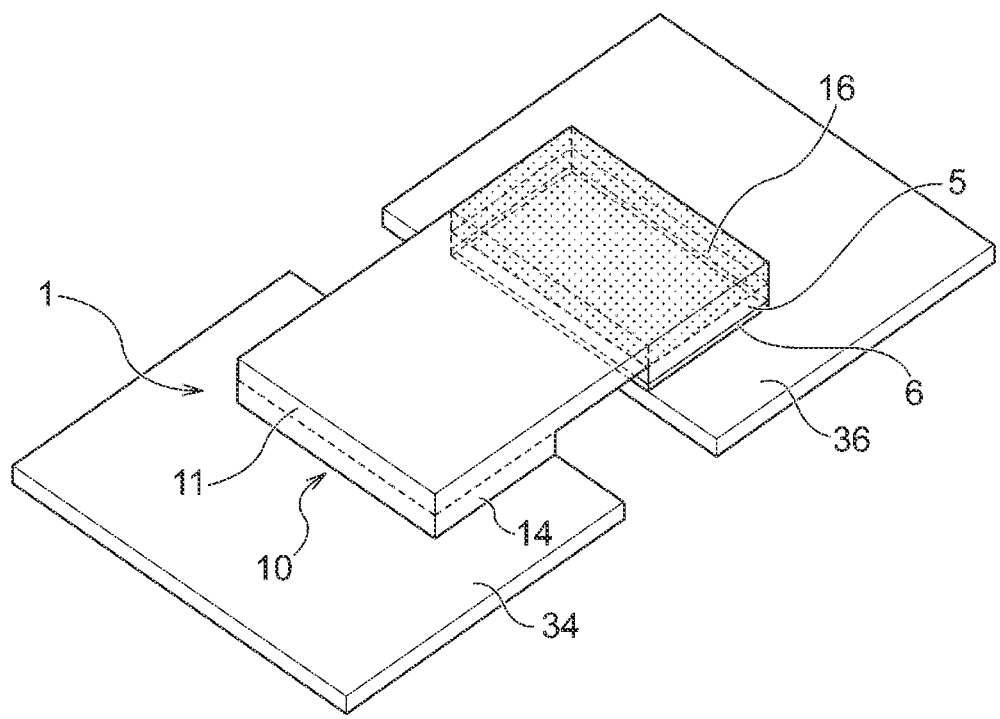
FIG. 5B is a diagram illustrating simulation conditions in the case of FIG. 5A.

FIG. 5A is a diagram showing a potential distribution in a portion of the body structure 11 located directly above the resistance element 5 when the jumper element 10 does not have the protrusion 12. FIG. 5A is a contour diagram showing a simulation result of the potential distribution. FIG. 5B is a diagram illustrating simulation conditions in the case of FIG. 5A. A portion 16 of the body structure 11 located directly above the resistance element 5 is a portion depicted with dots in FIG. 5B. As shown in FIG. 5B, the terminal structure 14 and the electrode 6 of the shunt resistor 1 are coupled to conductive lands 34 and 36, respectively. A predetermined current flows from the land 34 through the shunt resistor 1 to the land 36.

As shown in FIG. 5A, a potential distribution occurs in the region 16. Therefore, when the jumper element 10 does not have the protrusion 12 and a wire is directly connected to the body structure 11 to draw a voltage of the resistance element 5, a detected voltage (i.e., a potential difference in the resistance element 5), a detected resistance, or a temperature coefficient of resistance (T.C.R) of the shunt resistor 1 may vary depending on a connection position of the wire.

Figure 6:
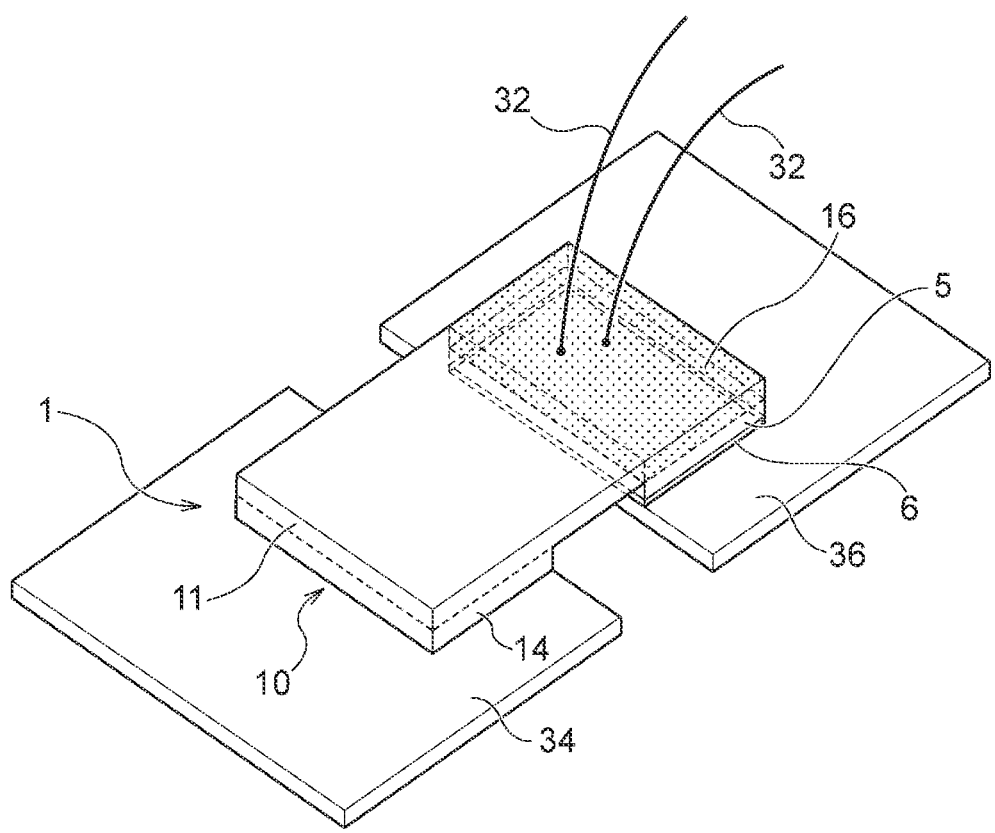
FIG. 6 is a diagram showing the jumper element which has been coupled to a plurality of wires for voltage detection.

In addition, as shown in FIG. 6, a plurality of wires 32 (two wires 32 in FIG. 6) for voltage detection may be connected to the jumper element 10 in order to prepare for wire deterioration or disconnection during long-term use. In this case, if one of the plurality of wires 32 is disconnected, a detected resistance or a temperature coefficient of resistance (T.C.R.) may change, because the drawn potential varies depending on the connection position of each wire 32.

Figure 7A:
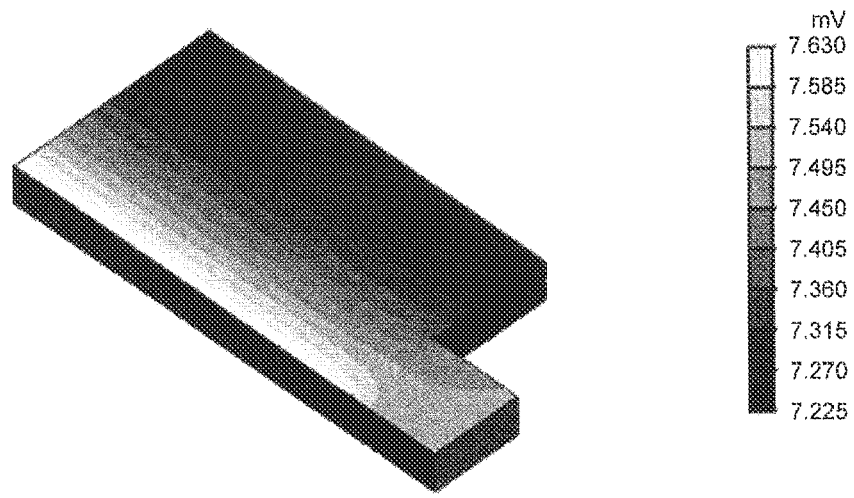
FIG. 7A is a diagram showing a potential distribution in a portion of the body structure located directly above the resistance element and the protrusion of the shunt resistor described with reference to FIGS. 1 and 2.
Figure 7B:
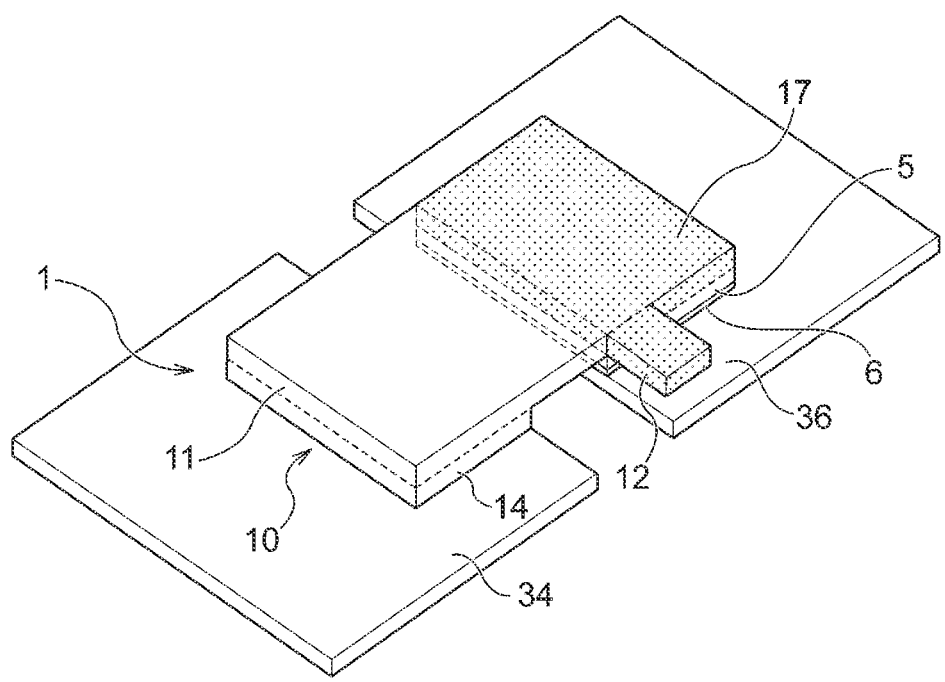
FIG. 7B is a diagram illustrating simulation conditions in the case of FIG. 7A.

FIG. 7A is a diagram showing a potential distribution in a portion of the body structure 11 located directly above the resistance element 5 and the protrusion 12 of the shunt resistor 1 described with reference to FIGS. 1 and 2. FIG. 7A is a contour diagram showing a simulation result of the potential distribution. FIG. 7B is a diagram illustrating simulation conditions in the case of FIG. 7A, An object 17 of the simulation is a portion located directly above the resistance element 5 of the body structure 11 and the protrusion 12. The object 17 is a portion depicted with dots in FIG. 7B. Simulation conditions, which will not be particularly described, are the same as the conditions described with reference to FIGS. 5A and 5B.

As shown in FIG. 7A, a potential distribution of the protrusion 12 is substantially uniform such that a potential of a portion of the body structure 11 next to the protrusion 12 spreads toward the protrusion 12. In other words, the potential distribution in the protrusion 12 is highly uniform. Therefore, a variation in detected voltage, a variation in detected resistance, or a variation in temperature coefficient of resistance (T.C.R.) due to the connection position of the wire can be suppressed by connecting the wire for voltage detection to the protrusion 12 to draw the voltage of the resistance element 5. As a result, a variation in characteristic of the shunt resistor apparatus due to the connection position of the wire for voltage detection on the protrusion 12 can be suppressed.

Furthermore, in the present embodiment, a potential distribution in the body structure 11 significantly spreads in the first direction (see FIG. 1A), Therefore, the detected resistance or the T.C.R. can be changed by shifting the position of the protrusion 12.

Figure 9:
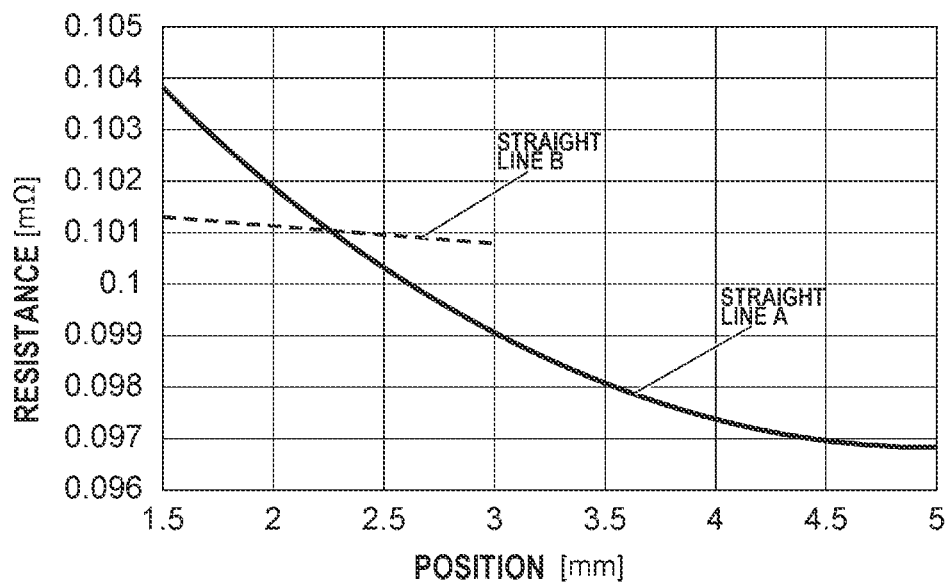
FIG. 9 is a graph showing a variation in resistance of the shunt resistor in relation to the measuring position.

FIG. 5 is a diagram illustrating a measuring position of the resistance and the T.C.R. of the shunt resistor 1. FIG. 9 is a graph showing a variation in resistance of the shunt resistor 1 in relation to the measuring position, FIG. 10 is a graph showing a variation in T.C.R. of the shunt resistor 1 in relation to the measuring position.

In this embodiment, the terminal structure 14 and the electrode 6 are coupled to the lands 34 and 36, respectively. FIG. 9 shows resistances between an arbitrary reference point having the same potential as the land 36 and each one point (hereinafter, referred to as a measuring position) on straight lines A and 13 shown in FIG. 8 when a predetermined current is applied from the land 34 to the land 36 via the shunt resistor 1. FIG. 10 shows simulation results of T.C.R. of the shunt resistor 1 at the measuring positions when the predetermined current is applied from the land 34 to the land 36 via the shunt resistor 1. In this embodiment, a set resistance (i.e., an ideal resistance) of the shunt resistor 1 is 100µΩ.

Figure 10:
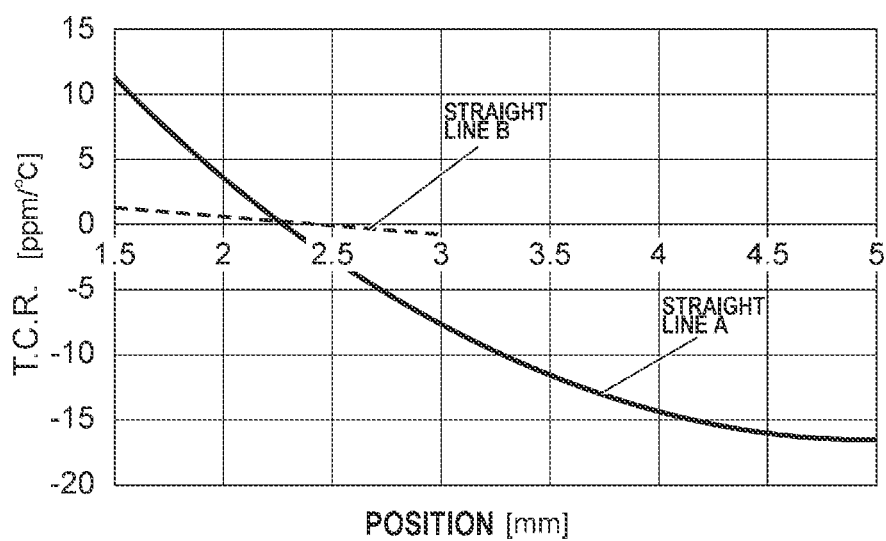
FIG. 10 is a graph showing a variation in T.C.R. of the shunt resistor in relation to the measuring position.

Horizontal axes in FIGS. 9 and 10 represent the measuring position for the resistance and the T.C.R. in the first direction, respectively. Vertical axis in FIG. 9 represents the resistance at each measuring position, and vertical axis in FIG. 10 represents the T.C.R. at each measuring position. In FIGS. 9 and 10, solid lines indicate the resistance and the T.C.R. on the straight line A, respectively, and dashed lines indicate the resistance and the T.C.R. on the straight line B, respectively.

Figure 8:
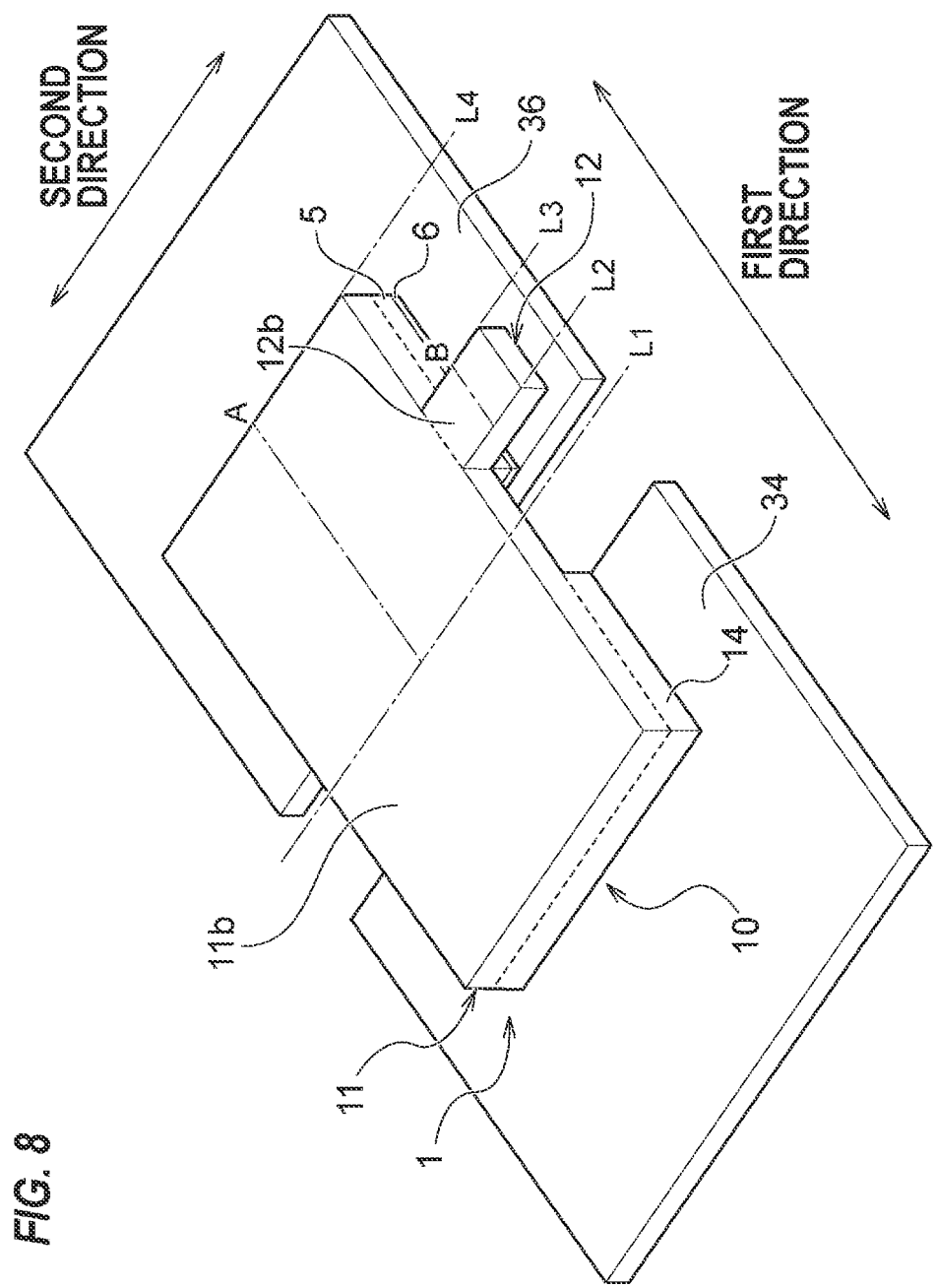
FIG. 8 is a diagram illustrating a measuring position for a resistance and a T.C.R. of the shunt resistor.

The straight lines A and B are imaginary straight lines extending in the first direction on the body-structure-side second surface 11b and the protrusion-side second surface 12b, respectively. Straight lines L1, L2, L3, and L4 shown in FIG. 8 indicate positions of 0 mm, 1.5 mm, 3.0 mm, and 5.0 mm in the first direction, respectively. Sizes of the body structure 11 and the protrusion 12 shown in FIG. 8 are examples, and sizes of the shunt resistor 1 and each component of the shunt resistor 1 are not limited to those of this embodiment.

As shown in FIGS. 9 and 10, the variations in resistance and T.C.R. on the straight line B are significantly smaller than the variations in resistance and T.C.R. on the straight line A. Therefore, the simulation results show that the resistance and the T.C.R. on the straight line B are substantially uniform regardless of the measuring positions. As a result, the variation in characteristic of the shunt resistor 1 (i.e., a variation in characteristic of the shunt resistor apparatus) due to the connection position of the wire for voltage detection on the protrusion 12 can be suppressed.

Figure 11:
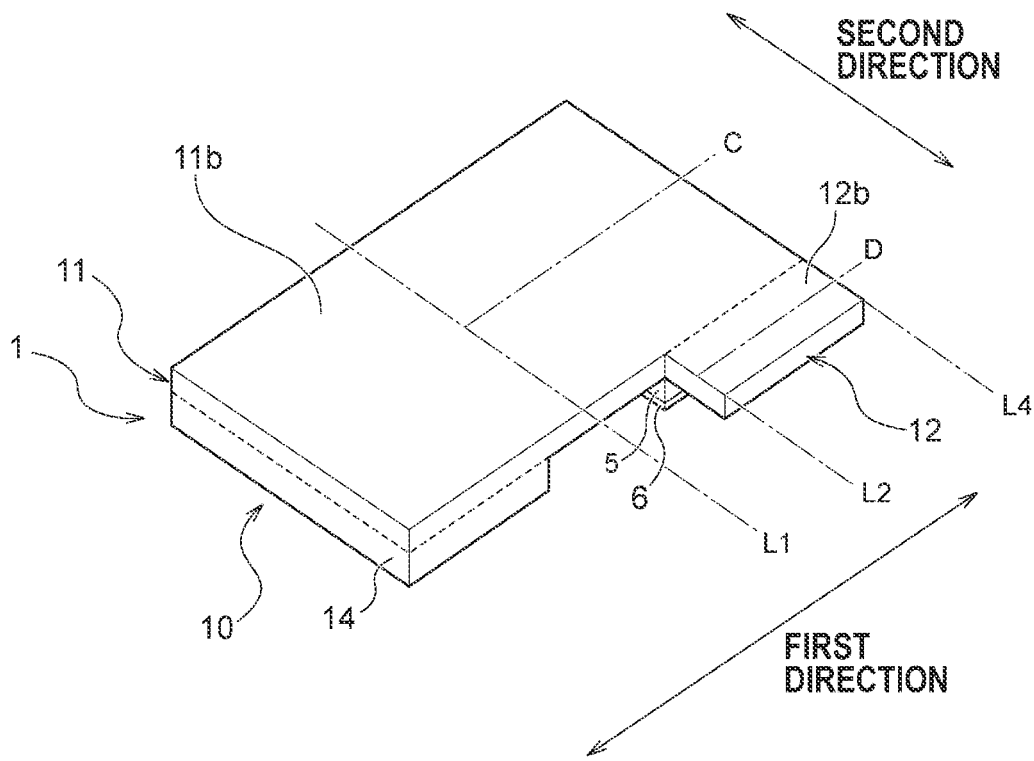
FIG. 11 is a perspective view schematically showing another embodiment of the shunt resistor.

FIG. 11 is a perspective view schematically showing another embodiment of the shunt resistor 1. Configurations of this embodiment, which will not be particularly described, are the same as those of the above-described embodiment, and duplicated descriptions will be omitted. In this embodiment, a length of the protrusion 12 in the first direction is the same as a length of the resistance element 5 in the first direction.

Figure 12:
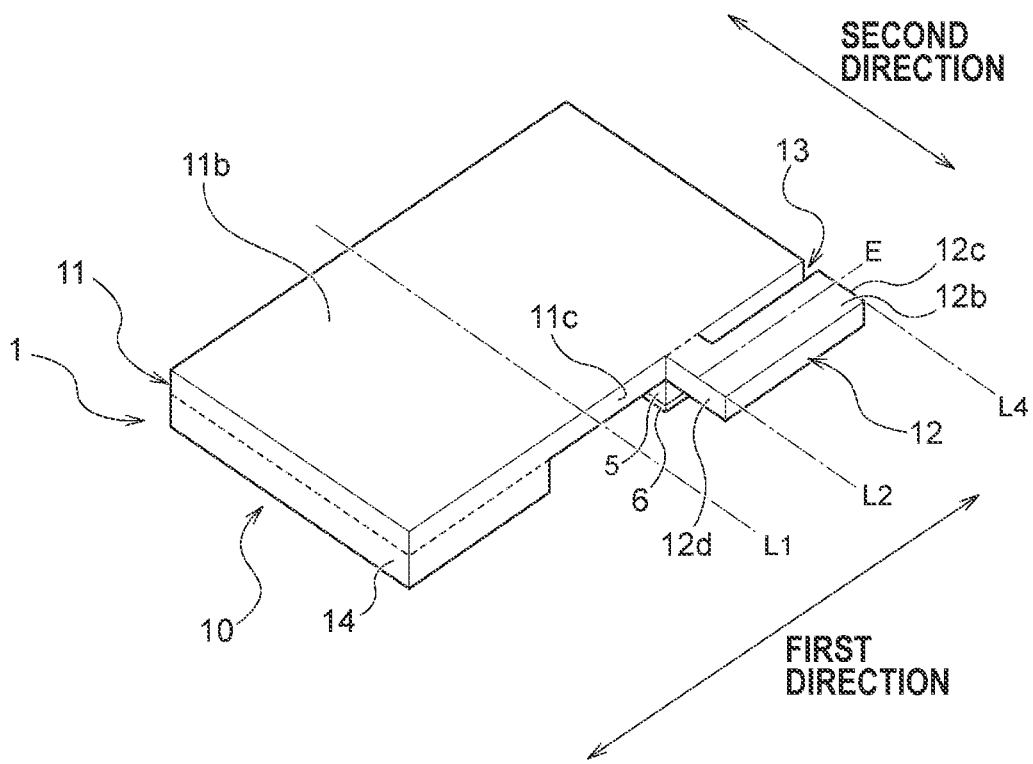
FIG. 12 is a perspective view schematically showing still another embodiment of the shunt resistor.

FIG. 12 is a perspective view schematically showing another embodiment of the shunt resistor 1. Configurations of this embodiment, which will not be particularly described, are the same as those of the above-described embodiment, and duplicated descriptions will be omitted. The jumper element 10 of this embodiment has a slit 13 formed in the protrusion 12. The slit 13 is an elongated cut. Specifically, the slit 13 extends from a side surface 12c of the protrusion 12 coupled to the body structure 11 toward a side surface 12d opposite to the side surface 12c. The side surface 12c faces outward of the shunt resistor 1, and the side surface 12d faces inward of the shunt resistor 1 (i.e., faces toward the terminal structure 14 in the first direction).

In this embodiment, the slit 13 is formed in a root portion of the protrusion 12. In other words, the slit 13 is formed between the body structure 11 and the protrusion 12. The position of the slit 13 is not limited to this embodiment as long as the slit 13 extends from the side surface 12c of the protrusion 12 coupled to the body structure 11.

Figure 13:
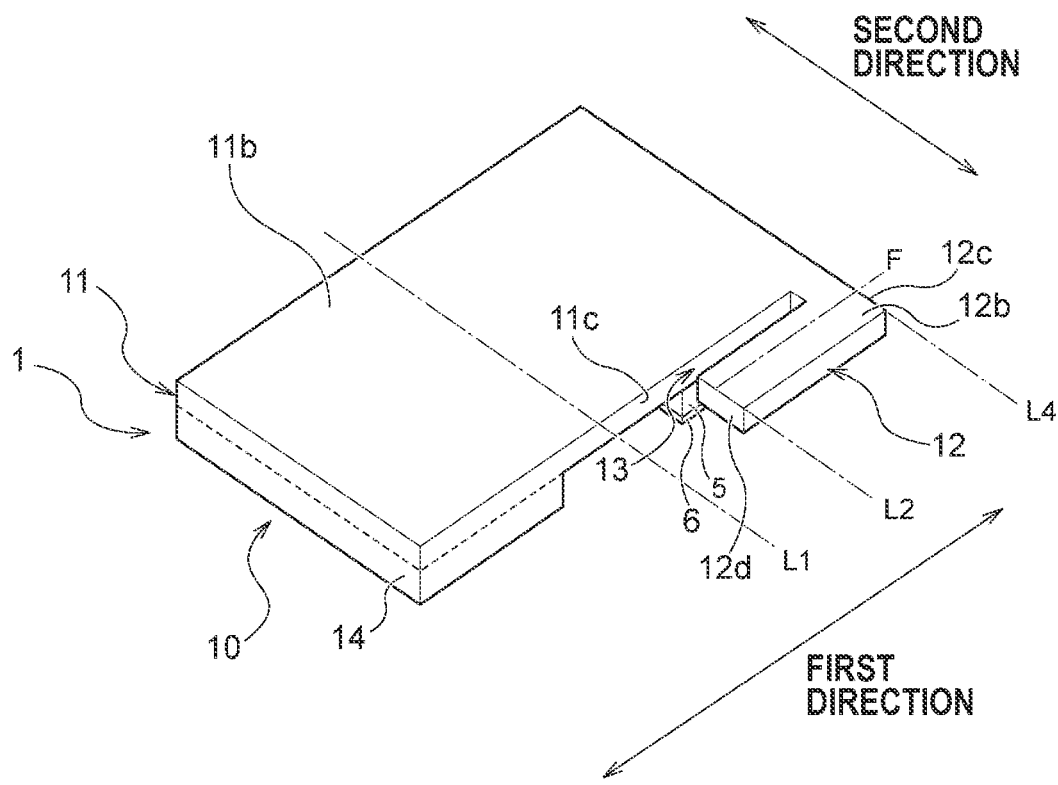
FIG. 13 is a perspective view schematically showing still another embodiment of the shunt resistor.

FIG. 13 is a perspective view schematically showing still another embodiment of the shunt resistor 1. Details of this embodiment, which will not be particularly described, are the same as those of the embodiment described with reference to FIG. 12, and duplicated descriptions will be omitted. This embodiment differs from the embodiment shown in FIG. 12 in that the slit 13 extends from the side surface 12d of the protrusion 12 coupled to the body structure 11 toward the side surface 12c. The position of the slit 13 is not limited to this embodiment as long as the slit 13 extends from the side surface 12d of the protrusion 12 coupled to the body structure 11.

Figure 14:
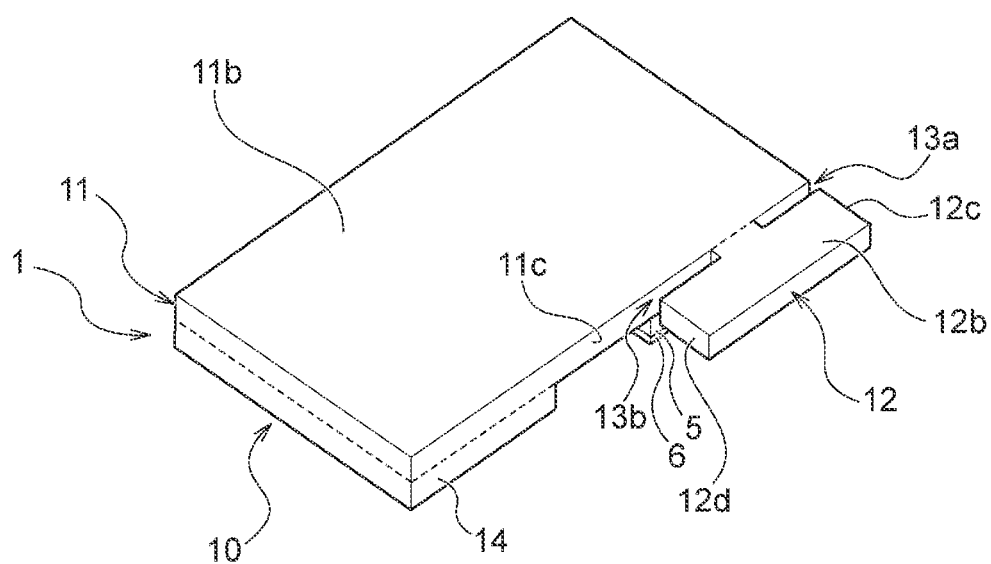
FIG. 14 is a perspective view schematically showing still another embodiment of the shunt resistor.

FIG. 14 is a perspective view schematically showing still another embodiment of the shunt resistor 1. Details of this embodiment, which will not be particularly described, are the same as those of the embodiment described with reference to FIGS. 12 and 13, and duplicated descriptions will be omitted. This embodiment differs from the embodiments shown in FIGS. 12 and 13 in that a slit 13a extending from the side surface 12c toward the side surface 12d and a slit 13b extending from the side surface 12d toward the side surface 12c are formed in the protrusion 12. Configurations of the slits 13a and 13b, which will not be particularly described, are the same as those of the slit 13 described with reference to FIGS. 12 and 13. The embodiments described with reference to FIGS. 11 to 14 may be applied to the embodiment described with reference to FIGS. 3A, 3B, and 4.

Figure 15:
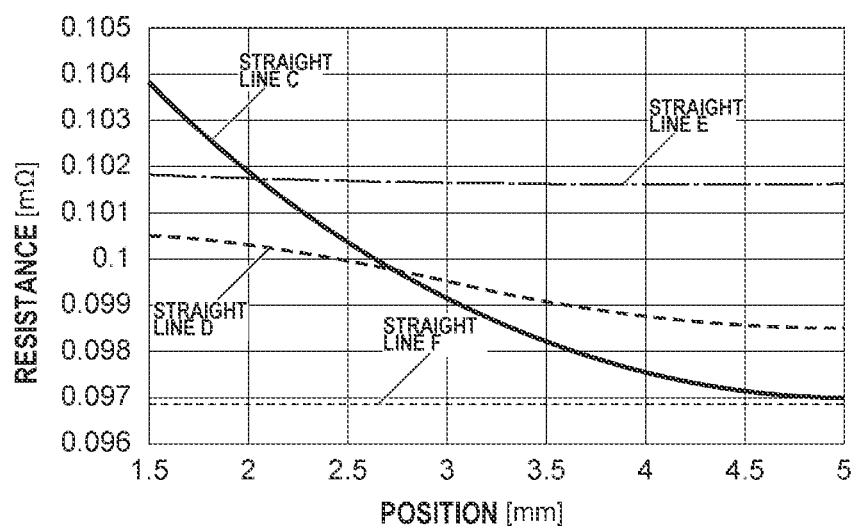
FIG. 15 is a graph showing variations in resistance of the shunt resistors shown in FIGS. 11 to 13 in relation to the measuring positions.
Figure 16:
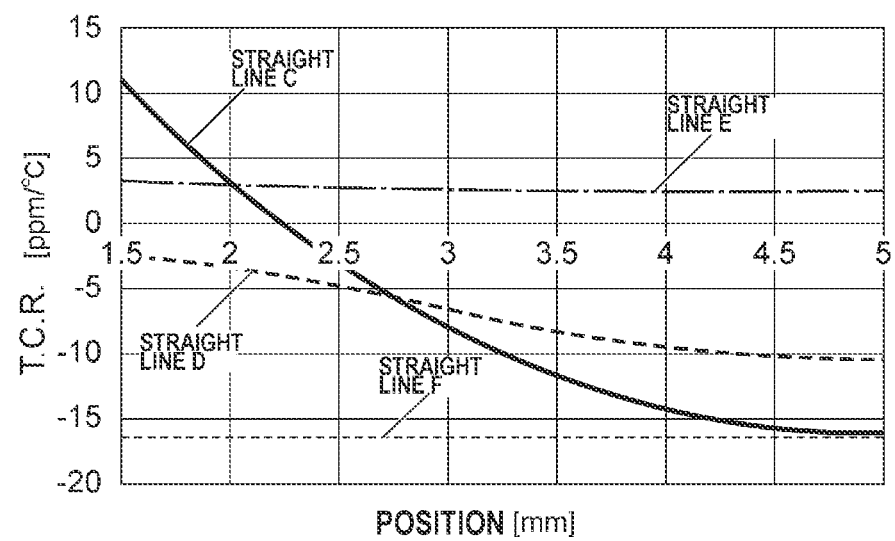
FIG. 16 is a graph showing variations in T.C.R. of the shunt resistors shown in FIGS. 11 to 13 in relation to the measuring positions.

FIG. 15 is a graph showing variations in resistance of the shunt resistors 1 shown in FIGS. 11 to 13 in relation to the measuring positions. FIG. 16 is a graph showing variations in T.C.R. of the shunt resistors 1 shown in FIGS. 11 to 13 in relation to the measuring positions. FIG. 15 shows resistances between an arbitrary reference point and each one point (hereinafter, referred to as a measuring position) on straight lines C, D, E, and shown in FIGS. 11 to 13. FIG. 16 shows simulation results of T.C.R. of the shunt resistor 1 at the measuring positions. Simulation conditions are the same as the conditions described with reference to FIGS. 8 to 10.

The straight lines C and D are imaginary straight lines extending in the first direction on the body-structure-side second surface 111 and the protrusion-side second surface 12b of the shunt resistor 1 shown in FIG. 11, respectively. The straight lines E and F are imaginary straight lines extending in the first direction on the protrusion-side second surfaces 12b of the shunt resistors 1 shown in FIGS. 12 and 13, respectively. A depth (or a length in the first direction) of the slits 13 shown in FIGS. 12 and 13 is 2.5 mm. Straight lines L1, 1.2, and LA represent positions of 0 mm, 1.5 mm, and 5.0 mm in the first direction, respectively. Sizes of the body structure 11 and the protrusion 12 shown in FIGS. 11 to 13 are examples, and sizes of the shunt resistor 1 and each component of the shunt resistor 1 are not limited to those of these embodiments.

Horizontal axes of FIGS. 15 and 16 represent the measuring position for the resistance and the T.C.R. in the first direction, respectively. Vertical axis in FIG. 15 represents the resistance at each measuring position, and vertical axis in FIG. 16 represents the T.C.R. at each measuring position. In FIGS. 15 and 16, solid lines indicate the resistance and the T.C.R. on the straight line C, respectively, thick-dashed lines indicate the resistance and the T.C.R. on the straight line D, respectively, dash-dotted lines indicate the resistance and the T.C.R. on the straight line E, respectively, and thin-dashed lines indicate the resistance and the T.C.R. on the straight line F, respectively.

As shown in FIGS. 15 and 16, values of the resistance and the T.C.R. vary little 90 in relation to the measuring position on the straight lines E and F. In the case where the slit 13 extends from the side surface 12c, values of the resistance and the T.C.R. increase. In the case where the slit 13 extends from the side surface 12d, values of the resistance and the T.C.R. decrease. This is because, as shown in FIG. 7A, the potential at the side surface 12d is higher than the potential at the side surface 12c, and the potential of the portion of the body structure 11 next to the protrusion 12 spreads toward the protrusion 12.

Specifically, when the depth of the slit 13 shown in 11G. 12 is changed so as to decrease, the resistance and the T.C.R. when the measuring position is located on the protrusion-side second surface 12b at the outside of the slit 13 (opposite side from the body structure 11 in the second direction) can be made smaller than the values shown in FIG. 15 (i.e., can be made closer to the resistance and the T.C.R. when the measuring position is located on the straight line D). When the depth of the slit 13 shown in FIG. 13 is changed so as to decrease, the resistance and the T.C.R. when the measuring position is located on the protrusion-side second surface 12b at the outside of the slit 13 (opposite side from the body structure 11 in the second direction) can be made larger than the values shown in FIG. 15 (i.e., can be made closer to the resistance and the T.C.R. when the measuring position is located on the straight line D).

Therefore, the potential distribution of the protrusion 12 can be more uniform by forming the above-described slit 13 in the protrusion 12, Thus, the characteristic of the shunt resistor apparatus, i.e., the resistance and/or the T.C.R. of the shunt resistor apparatus, can be adjusted by forming the slit 13. Specifically, the characteristic of the shunt resistor apparatus, i.e., the resistance and/or the T.C.R. of the shunt resistor apparatus, when the measuring position is located on the protrusion-side second surface 12b can be adjusted by adjusting the cutting direction and the depth of the slit 13.

In one embodiment, the jumper element 10 and the shunt resistor may be separately formed in advance and fixed together during being mounted.

Figure 17:
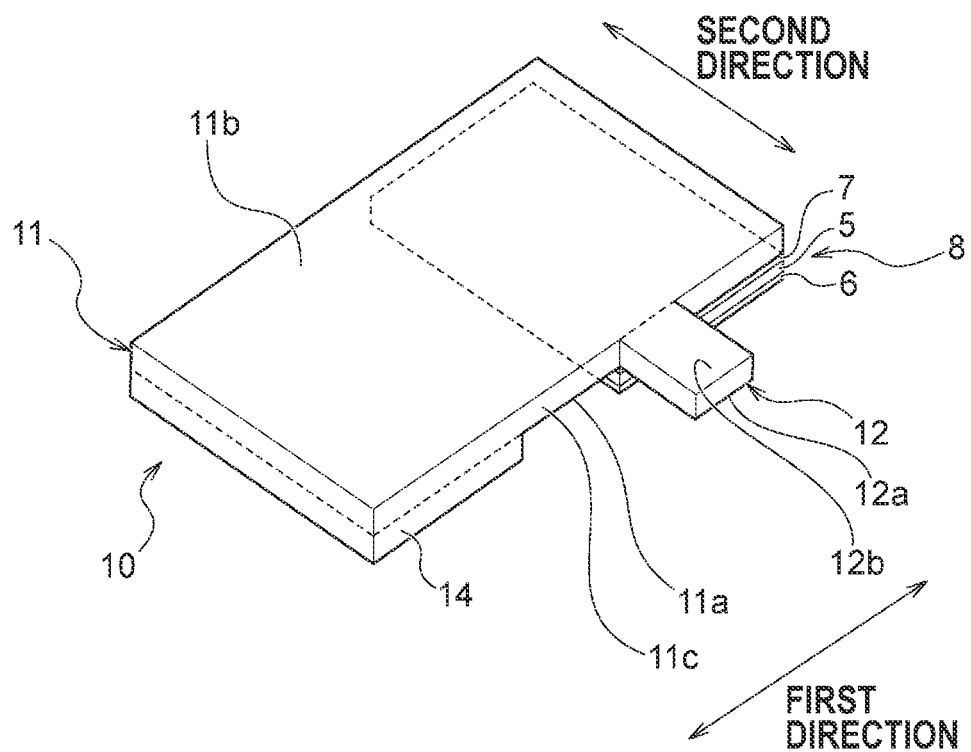
FIG. 17 is a perspective view schematically showing still another embodiment of the shunt resistor apparatus.

FIG. 17 is a perspective view schematically showing still another embodiment of the shunt resistor apparatus. Configurations of this embodiment, which will not be particularly described, are the same as those of the above-described embodiment, and duplicated descriptions will be omitted. The shunt resistor apparatus of this embodiment includes a shunt resistor 8, and a jumper element 10 coupled to the shunt resistor 8. In this embodiment, the shunt resistor S and the jumper element 10 are separately formed in advance. Details of the juniper element 10, which will not be particularly described, are the same as those of the above-described embodiments. The body-structure-side first surface 11a of the body structure 11 of the present embodiment can be coupled to the resistance element 5 constituting a part of the shunt resistor 8. Specifically, the body structure 11 can be connected (or be coupled) to the resistance element 5 via an electrode 7 which will be described later.

Figure 18:
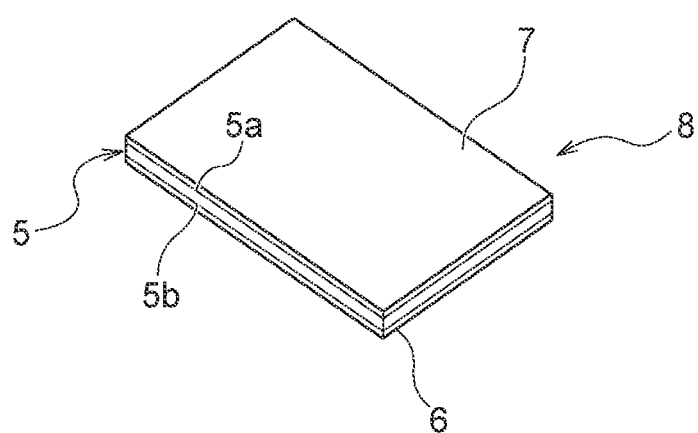
FIG. 18 is a perspective view schematically showing the shunt resistor shown in FIG. 17.

FIG. 18 is a perspective view schematically showing the shunt resistor 8 shown in FIG. 17. Configurations of the shunt resistor 8, which will not be particularly described, are the same as those of the shunt resistor 1, and duplicated descriptions will be omitted. The shunt resistor 8 differs from the shunt resistor 1 in that the shunt resistor 8 includes a plate-shaped (thin plate-shaped) electrode 7 made of conductive metal material, instead of the jumper element 10.

An example of the material of the electrode 7 is copper (Cu) which is highly conductive metal. The electrode 7 is coupled to the first surface 5a of the resistance element 5. The electrode 6, the resistance element 5, and the electrode 7 are stacked in this order in a thickness direction of the shunt resistor 8. In the embodiment shown in FIG. 17, the jumper element 10 is coupled to the electrode 7. Specifically, the body structure 11 of the jumper element 10 is coupled to the first surface 5a of the resistance element 5. More specifically, the body-structure-side first surface 11a of the body structure 11 of the jumper element 10 is connected (or is coupled) to the first surface 5a of the resistance element 5 via the electrode 7. The terminal structure 14 and the shunt resistor 8 are separated from each other in the first direction.

In this embodiment, the protrusion 12 is also located so as not to overlap the resistance element 5. In other words, the protrusion 12 is located so as not to overlap the 90 resistance element 5 in the thickness direction of the shunt resistor apparatus, and is not in direct contact with the shunt resistor 8. In one embodiment, the body-structure-side first surface 11a of the jumper element 10 is coupled (or is joined) to the electrode 7 by welding (e.g., pressure welding), soldering, or joining with metal nanoparticles (silver paste using silver nanoparticles, or copper paste using copper nanoparticles).

Figure 19:
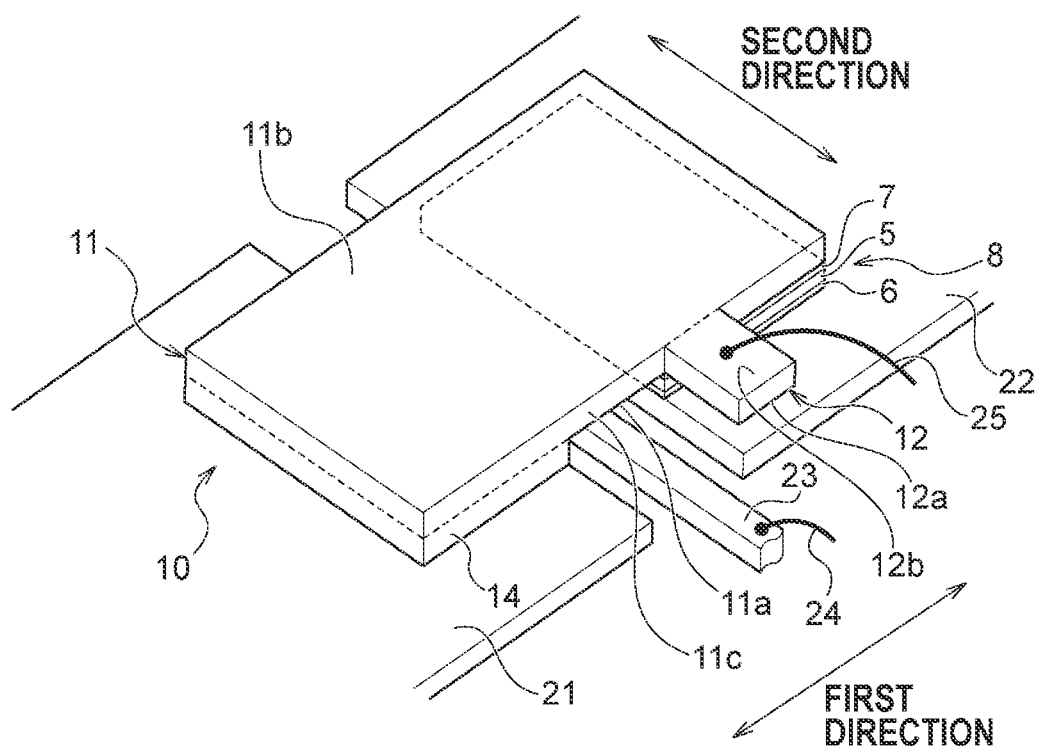
FIG. 19 is a perspective view schematically showing still another embodiment of the shunt resistor apparatus.
Figure 20:
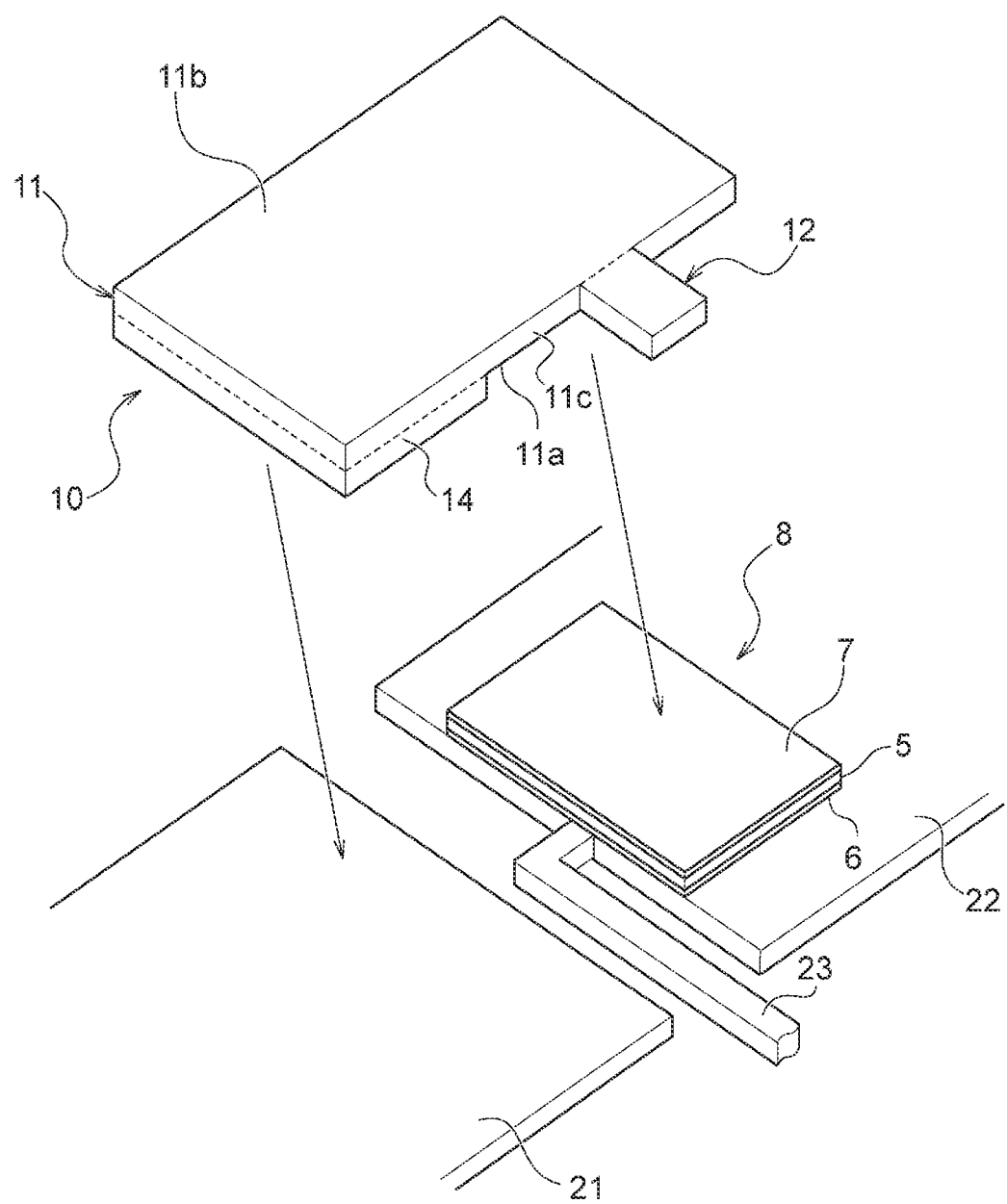
FIG. 20 is an exploded perspective view of the shunt resistor apparatus shown in FIG. 19.

FIG. 19 is a perspective view schematically showing still another embodiment of the shunt resistor apparatus. FIG. 20 is an exploded perspective view of the shunt resistor apparatus shown in FIG. 19. Details of the present embodiment, which will not be particularly described, are the same as those of the embodiments described with reference to FIGS. 3A, 3B, and 4, and duplicated descriptions will be omitted. This embodiment differs from the embodiments shown in FIGS. 3A, 3B, and 4 in that the shunt resistor apparatus described with reference to FIGS. 17 and 18 is mounted to the interconnect patterns 21 and 22. In this embodiment, the shunt resistor 8 is mounted to the interconnect pattern 22, the jumper element 10 is then mounted to the shunt resistor 8, and the terminal structure 14 is coupled to the interconnect pattern 21. In this embodiment, the interconnect pattern 21, the jumper element 10, the shunt resistor 8, and the interconnect pattern 22 constitute a current path.

The embodiments described with reference to FIGS. 11 to 14 can also be applied to the embodiments described with reference to FIGS. 17 to 20. The embodiments described with reference to FIGS. 17 to 20 can also achieve the same effects as those described with reference to FIGS. 7A to 16. In the embodiments described with reference to FIGS. 17 to 20, the characteristic of the shunt resistor apparatus, i.e., the resistance and/or the T.C.R. of the shunt resistor apparatus, when the measuring position is located on the protrusion-side second surface 12h can also be adjusted by adjusting the cutting direction and the depth of the slit 13.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments. Therefore, the present invention is not intended to be limited to the embodiments described herein but is to be accorded the widest scope as defined by limitation of the claims.

INDUSTRIAL APPLICABILITY

The present invention is applicable to a jumper element, a shunt resistor apparatus, and a method of adjusting characteristic of a shunt resistor apparatus for current detection.

REFERENCE SIGNS LIST 1 shunt resistor
5 resistance element
5a first surface
5b second surface
6 electrode
7 electrode
8 shunt resistor
10 jumper element
11 body structure
11a body-structure-side first surface
11b body-structure-side second surface
11c side surface
12 protrusion
12a protrusion-side first surface
12b protrusion-side second surface
12c, 12d side surface
13, 13a, 13b slit
14 terminal structure
21 interconnect pattern
22 interconnect pattern
23 lead
24 wire
25 wire
32 wire

The invention claimed is:

1. A jumper element for constituting a shunt resistor apparatus for current detection, comprising:
a body structure that can be coupled to a resistance element constituting a part of the shunt resistor apparatus, the resistance element having a plate shape having a first surface and a second surface opposite to the first surface in a thickness direction of the resistance element; and
a protrusion formed on a side portion of the body structure,
wherein the body structure includes a coupling surface to be overlapped with and coupled to the first surface of the resistance element in the thickness direction of the resistance element,
the protrusion protrudes from a side surface of the body structure located at an end of the coupling surface,
wherein the jumper element is made of conductive metal material, and
the protrusion is located so as not to overlap the resistance element in the thickness direction.

2. The jumper element according to claim 1, wherein
the body structure has a body-structure-side first surface that can be coupled to the resistance element, and
the protrusion has a protrusion-side first surface at the same side as the body-structure-side first surface in a thickness direction of the jumper element, and further has a protrusion-side second surface opposite to the protrusion-side first surface.

3. The jumper element according to claim 1, wherein a slit is formed in the protrusion, and the slit extends from a side surface of the protrusion.

4. A shunt resistor apparatus for current detection, comprising:
a plate-shaped resistance element having a first surface and a second surface opposite to the first surface in a thickness direction of the resistance element; and
a terminal member made of conductive metal material, wherein the terminal member includes:
a body structure coupled to the first surface; and
a protrusion formed on a side portion of the body structure,
wherein the body structure includes a coupling surface to be overlapped with and coupled to the first surface of the resistance element in the thickness direction of the resistance element,
the protrusion protrudes from a side surface of the body structure located at an end of the coupling surface, and
the protrusion is located so as not to overlap the resistance element in the thickness direction.

5. The shunt resistor apparatus according to claim 4, wherein a slit is formed in the protrusion, and the slit extends from a side surface of the protrusion.

6. The shunt resistor apparatus according to claim 4, further comprising a pair of wires for detecting a potential difference in the resistance element, one of the pair of wires being coupled to the protrusion.

7. A method of adjusting characteristic of a shunt resistor apparatus for current detection, comprising:
adjusting a resistance and/or a temperature coefficient of resistance of the shunt resistor apparatus by forming a slit in a protrusion,
wherein the shunt resistor apparatus includes:
a plate-shaped resistance element having a first surface and a second surface opposite to the first surface in a thickness direction of the resistance element; and
a body structure made of conductive metal material and coupled to the first surface; and
a terminal member including the protrusion formed on a side portion of the body structure,
wherein the body structure includes a coupling surface to be overlapped with and coupled to the first surface of the resistance element in the thickness direction of the resistance element,
the protrusion protrudes from a side surface of the body structure located at an end of the coupling surface, and
the protrusion is located so as not to overlap the resistance element in the thickness direction.

* * * * *